US010319598B2

(12) United States Patent
Kim

(10) Patent No.: US 10,319,598 B2
(45) Date of Patent: Jun. 11, 2019

(54) METHOD AND APPARATUS FOR THINNING WAFER

(71) Applicant: Hanwha Techwin Co., Ltd., Changwon-si (KR)

(72) Inventor: Sung Wook Kim, Changwon-si (KR)

(73) Assignee: HANWHA PRECISION MACHINERY CO., LTD., Changwon-si (KR)

( * ) Notice: Subject to any disclaimer, the term of this patent is extended or adjusted under 35 U.S.C. 154(b) by 746 days.

(21) Appl. No.: 14/785,372

(22) PCT Filed: Apr. 2, 2014

(86) PCT No.: PCT/KR2014/002808
§ 371 (c)(1),
(2) Date: Oct. 19, 2015

(87) PCT Pub. No.: WO2014/171649
PCT Pub. Date: Oct. 23, 2014

(65) Prior Publication Data
US 2016/0064229 A1 Mar. 3, 2016

(30) Foreign Application Priority Data
Apr. 18, 2013 (KR) .................. 10-2013-0043080

(51) Int. Cl.
*H01L 21/304* (2006.01)
*B23K 26/00* (2014.01)
(Continued)

(52) U.S. Cl.
CPC ........ *H01L 21/304* (2013.01); *B23K 26/0738* (2013.01); *B23K 26/0853* (2013.01);
(Continued)

(58) Field of Classification Search
CPC . H01L 21/304; B23K 26/0057; B23K 26/402; B23K 26/362; B23K 26/364; B23K 26/50; B23K 26/53; B28D 5/0011
(Continued)

(56) References Cited

U.S. PATENT DOCUMENTS 8,021,963 B2  9/2011 Sekiya
2004/0058537 A1  3/2004 Yanagita et al.
(Continued)

FOREIGN PATENT DOCUMENTS

JP  2010-021398 A  1/2010
JP  2012-169363 A  9/2012
(Continued)

OTHER PUBLICATIONS

International Search Report (PCT/ISA/210) dated Jul. 17, 2014, issued in International Application No. PCT/KR2014/002808.
(Continued)

*Primary Examiner* — Samuel M Heinrich
(74) *Attorney, Agent, or Firm* — Sughrue Mion, PLLC

(57) ABSTRACT

A method and an apparatus for thinning a wafer are provided. The method for thinning a wafer, according to one embodiment of the present invention, comprises the steps of: irradiating a line beam focused at a specific depth of the wafer; scanning the wafer by using the line beam so as to form an interface at the specific depth of the wafer; and cleaving the wafer on which the interface is formed into a pattern wafer and a dummy wafer.

4 Claims, 10 Drawing Sheets

(51) Int. Cl.

| | | |
|---|---|---|
| *B23K 26/402* | (2014.01) | |
| *B28D 5/00* | (2006.01) | |
| *B23K 26/53* | (2014.01) | |
| *H01L 21/78* | (2006.01) | |
| *B23K 26/40* | (2014.01) | |
| *B23K 26/073* | (2006.01) | |
| *B23K 26/08* | (2014.01) | |
| *B23K 26/70* | (2014.01) | |
| *B23K 103/00* | (2006.01) | |
| *B23K 101/40* | (2006.01) | |
| *B23K 103/16* | (2006.01) | |

(52) U.S. Cl.
CPC .......... *B23K 26/0876* (2013.01); *B23K 26/40* (2013.01); *B23K 26/402* (2013.01); *B23K 26/53* (2015.10); *B23K 26/702* (2015.10); *B28D 5/0011* (2013.01); *H01L 21/78* (2013.01); *B23K 2101/40* (2018.08); *B23K 2103/172* (2018.08); *B23K 2103/50* (2018.08); *B23K 2103/56* (2018.08)

(58) Field of Classification Search
USPC .............. 219/121.6, 121.68, 121.69, 121.85; 438/463
See application file for complete search history.

(56) References Cited

U.S. PATENT DOCUMENTS

| | | | |
|---|---|---|---|
| 2009/0029525 A1 | 1/2009 | Ohnuma | |
| 2009/0111203 A1* | 4/2009 | Nakamura | .......... H01L 33/0095 438/33 |
| 2009/0212397 A1* | 8/2009 | Tuttle | ................ H01L 27/14634 257/618 |
| 2011/0031620 A1 | 2/2011 | Codding et al. | |
| 2011/0132885 A1 | 6/2011 | Sercel et al. | |

FOREIGN PATENT DOCUMENTS

| | | |
|---|---|---|
| KR | 20-0373909 Y1 | 1/2005 |
| KR | 10-2009-0025257 A | 3/2009 |
| KR | 1020090124928 A | 12/2009 |
| KR | 10-2010-0007713 A | 1/2010 |
| KR | 1020130033114 A | 4/2013 |
| WO | 2012/108052 A1 | 8/2012 |

OTHER PUBLICATIONS

Communication dated Jun. 12, 2017 by the Korean Intellectual Property Office in counterpart Korean patent application No. 10-2013-0043080.

Communication dated Nov. 21, 2017, issued by the Korean Intellectual Property Office in corresponding Korean Application No. 10-2013-0043080.

Communication dated Jun. 12, 2017, issued by the Korean Intellectual Property Office in corresponding Korean Application No. 10-2013-0043080.

Communication dated Oct. 24, 2016, issued by the Japanese Patent Office in counterpart Japanese application No. 2016-508855.

Communication dated Feb. 14, 2017, issued by the Korean Intellectual Property Office in counterpart Korean application No. 10-2013-0043080.

* cited by examiner

METHOD AND APPARATUS FOR THINNING WAFER

TECHNICAL FILED

The present invention relates to a method and an apparatus for thinning a wafer, and more particularly, to a method and an apparatus for thinning a wafer, capable of cleaving a wafer by scanning using a laser line beam focused at a specific depth of the wafer according to a desired thickness of the wafer to form an interface, thereby simply separating the wafer at the desired thickness thereof.

BACKGROUND ART

Miniaturization and slimness of electric and electronic devices require the thinning of dies. During the manufacturing of a semiconductor chip such as an integrated circuit, a circuit may be formed on a semiconductor wafer and then, the wafer may be individualized and separated into respective portions or dies, whereby costs may be reduced and a processing process may be simplified, as compared to the case of forming individual devices.

FIG. 1 is views illustrating a process of separating dies from a wafer in the related art.

Referring to FIG. 1, in order to protect a circuit 2 formed on one surface of a wafer 1, a protective film 5 may be attached onto the wafer 1 on which the circuit 2 is formed (refer to FIG. 1(a)). Back grinding may be typically performed on the wafer 1 before being separated into dies 3 through chemical or mechanical planarization or using other technologies for removing a material, and in this case, the material may be removed from a lower portion or the back side of the wafer, such that the wafer has a smooth lower surface. Such a process is called "wafer back grinding", that is, a process of supporting the wafer 1 using a wafer chuck 15 prior to the assembling of a semiconductor, and thinning the wafer 1 by a grinder 10 to uniformalize a thickness of the wafer 1, simultaneously with grinding the wafer to a desired thickness (refer to FIG. 1(b)). In addition, a protective film 5 may be removed and in order to mechanically support the dies during a separation process, a mount film 20 may be attached and fixed by a wafer ring 25 (refer to FIG. 1(c)). By the mechanical forming of a scribing line 30 through the wafer 1 from an upper surface of the wafer 1, cut individual dies 2 physically separated from the wafer 1 may be provided (refer to FIG. 1(d)). In order to detach the individual dies 2 from the wafer 1, the wafer ring 25 may be moved to expand the mount film 20 (refer to FIG. 1(e)). In addition, the individual dies 2 may be completely separated from the wafer 1 (refer to FIG. 1(f)), and the separated dies 3 may be detached from each other to be assembled in an integrated circuit chip, or be directly fixed to a printed circuit board (PCB). The electrical connection of the separated dies 3 may be performed by one or more electrically-conducting bonding wires disposed on the dies. In particular, the process of separating the dies 3 from the wafer 1 is called a sawing or dicing process.

FIG. 2 is a view illustrating wafer back grinding in the related art. FIG. 3 is a view illustrating thickness variations of the wafer according to the wafer back grinding in the related art.

Referring to FIG. 2 and FIG. 3, a wafer grinding technique using a grinding wheel 10 according to the related art is a method of grinding directly a surface of the wafer 1 by the grinding wheel 10 rotating at high speed, and is conducted while spraying DI water during a process in order to remove mechanical fractional heat and foreign materials. The wafer 1 disposed on the wafer chuck 15 may be unavoidably, mechanically stressed. The stress may cause, after grinding, breakage of the wafer 1 or the like, in a process of detaching the protective film 5 attached to an opposite surface. The surface of the wafer 1 on which the circuit 2 is formed may be fixed to the wafer chuck 15 in a state in which the protective film 5 is attached to the wafer 1. The protective film 5 may bent according to a pattern height of the circuit 2 of the wafer 1 and in this state, may be fixed to the wafer chuck 15. A shape of a pattern surface transferred onto the protective film 5 of the wafer 1 may be shown on a ground surface of the wafer as the wafer 1 is fixed to the wafer chuck 15 and is ground to have a reduced thickness, thereby causing variations in the overall thickness of the wafer 1.

In addition, an etching method of chemically grinding the back side of a wafer is a method of reducing a thickness of the wafer by melting a surface of the wafer with the use of strong chemicals. Such a method is a removal method using a chemical reaction between the chemicals and a material of the wafer and requires a relatively long process time, as compared to mechanical methods.

Both the mechanical method and the chemical method as described above may have defects in which a wafer may be mechanically or chemically stressed during a wafer thinning process of thinning the wafer, thereby causing cracks or the like in the wafer after the thinning. In addition, during the wafer thinning process of thinning the wafer, a considerable amount of waste water may be caused and accordingly, a separate processing cost may be required. Further, the both methods may have common defects in which a considerable thickness of the wafer is unable to be recycled and is discarded.

DISCLOSURE OF INVENTION

Technical Problem

An aspect of the present invention may provide a method and an apparatus for thinning a wafer, capable of scanning the wafer in a plane direction by using a laser line beam focused at a specific depth of the wafer according to a desired thickness of the wafer to form an interface; and cleaving the wafer based on a plane layer of the interface to simply perform the thinning of the wafer at the desired thickness thereof.

Another aspect of the present invention may also provide a method and an apparatus for thinning a wafer, capable of forming the interface by scanning the wafer in the plane direction using the laser line beam focused at a specific depth of the wafer according to a desired thickness of the wafer and at the same time, forming grid pattern lines at specific intervals to thereby replace a dicing process of cutting the wafer into portions having desired sizes.

However, aspects of the present invention are not restricted to the one set forth herein. The above and other aspects of the present invention will become more apparent to one of ordinary skill in the art to which the present invention pertains by referencing the detailed description of the present invention given below.

Solution to Problem

A method for thinning a wafer according to an exemplary embodiment of the present invention may include: irradiating a line beam focused at a specific depth of a wafer;

scanning the wafer by using the line beam and forming an interface at the specific depth of the wafer; and cleaving the wafer in which the interface is formed into a pattern wafer and a dummy wafer.

An apparatus for thinning a wafer according to an exemplary embodiment of the present invention may include: a wafer support unit supporting and fixing one surface of a wafer thereby; a laser light source unit irradiating a laser beam; a line beam-optical unit generating a line beam by shaping the laser beam and irradiating the line beam to a specific depth of the wafer in accordance with a size of the wafer; a gantry unit transferring at least one of the line beam-optical unit or the wafer support unit in an XY direction in order to scan the wafer using the line beam; a wafer fixing unit fixing the other surface of the wafer; and a cleaving and transferring unit transferring the wafer support unit and the wafer fixing unit in opposite directions and cleaving the wafer into a pattern wafer and a dummy wafer based on an interface formed at the specific depth of the wafer by scanning using the line beam.

Other concrete matters of the present invention are included in the detailed description and drawings of the specification.

Advantageous Effects

According to the present invention, a method and an apparatus for thinning a wafer, capable of scanning the wafer in a plane direction by using a laser line beam focused at a specific depth of the wafer according to a desired thickness of the wafer to form an interface; and cleaving the wafer based on a plane layer of the interface to simply perform the thinning of the wafer at the desired thickness thereof, may be provided.

In addition, a method and an apparatus for thinning a wafer, capable of forming the interface by scanning the wafer in the plane direction using the laser line beam focused at a specific depth of the wafer according to a desired thickness of the wafer and at the same time, forming grid pattern lines at specific intervals to thereby replace a dicing process of cutting the wafer into portions having desired sizes, may be provided.

In addition, stress of the wafer may be minimized by simplifying a wafer thinning process, the occurrence of waste water may be remarkably reduced, and an expensive wafer may be recycled.

BEST MODE

Figure 1:
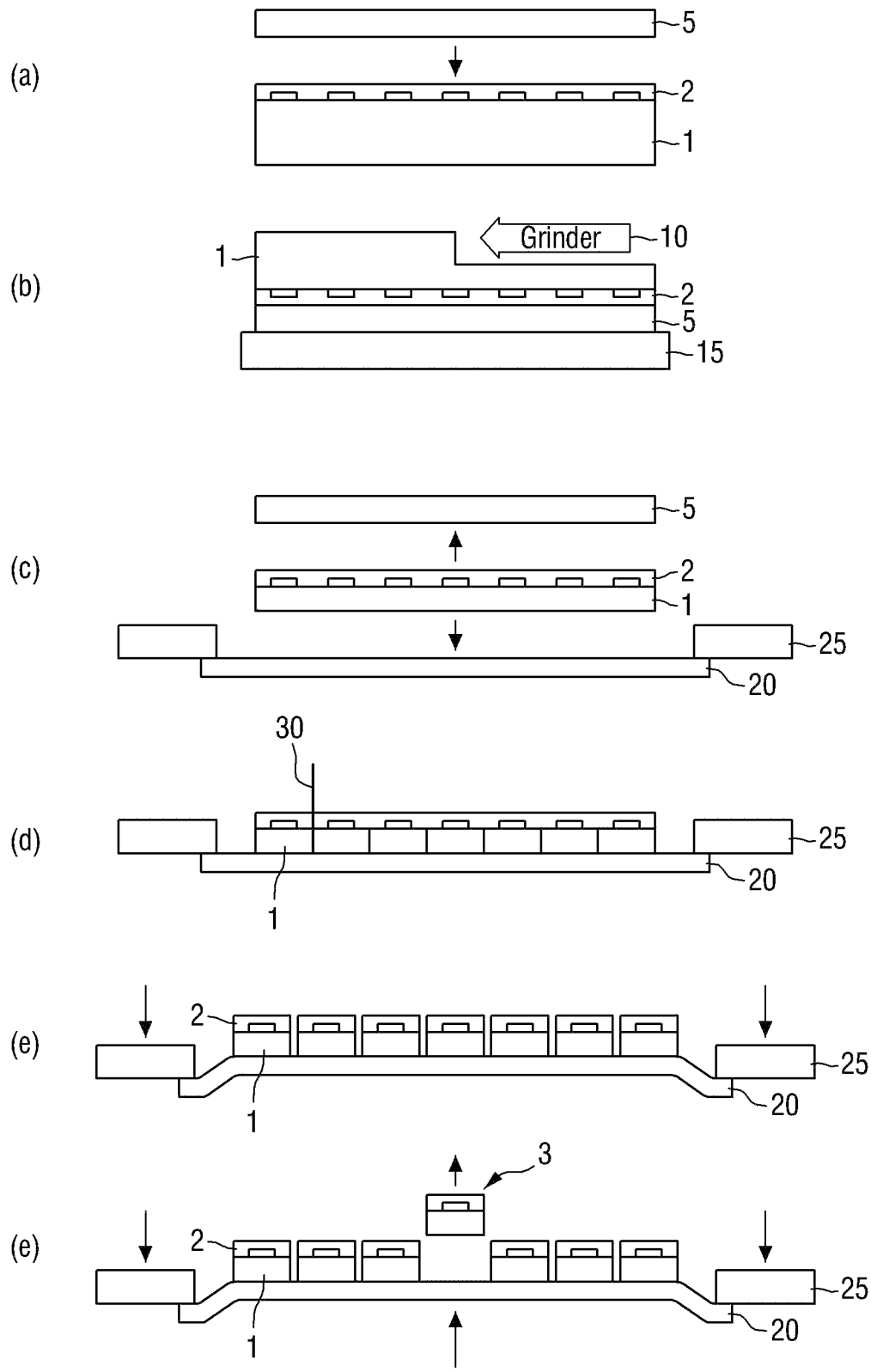
FIG. 1 is views illustrating a process of separating dies from a wafer in the related art.
Figure 2:
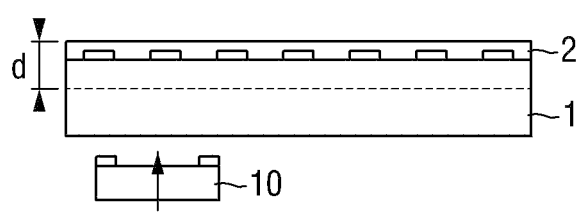
FIG. 2 is a view illustrating wafer back grinding in the related art.
Figure 2:
Figure 2:
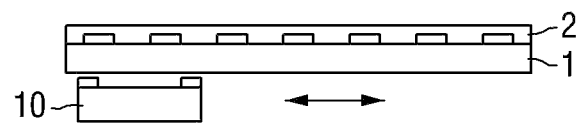
Figure 2:
Figure 2:
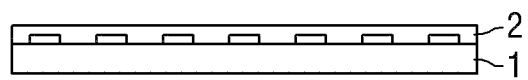
Figure 3:
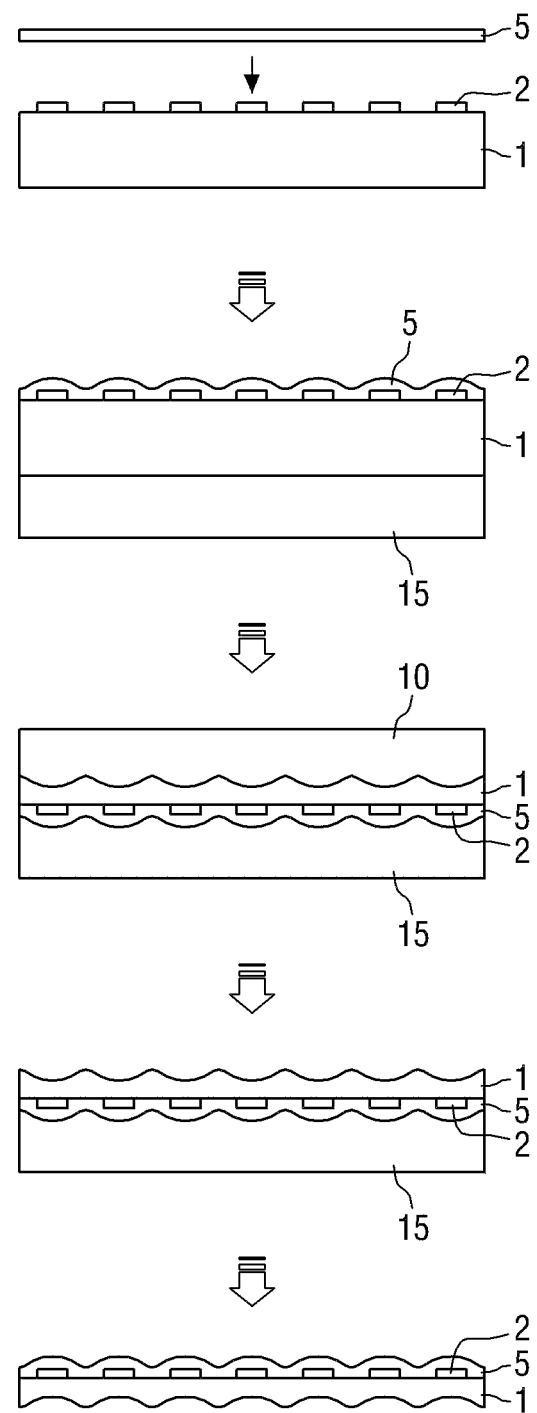
FIG. 3 is a view illustrating thickness variations of the wafer according to the wafer back grinding in the related art.

The cleaving of a wafer may be performed by scanning using a laser line beam focused at a specific depth of the wafer according to a desired thickness of the wafer to form an interface, thereby simply separating the wafer at the desired thickness.

DETAILED DESCRIPTION

Hereinafter, preferable embodiments of the present invention will be described in detail with reference to the attached drawings. Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. The same reference numerals will be used throughout to designate the same or like elements.

Otherwise defined, all terms used in the specification (including technical and scientific terms) may be used with meanings commonly understood by a person having ordinary knowledge in the art. Further, unless explicitly defined to the contrary, the terms defined in a generally-used dictionary are not ideally or excessively interpreted.

Hereinafter, a description of the present invention will be provided in detail in accordance with the attached drawings.

Figure 4:
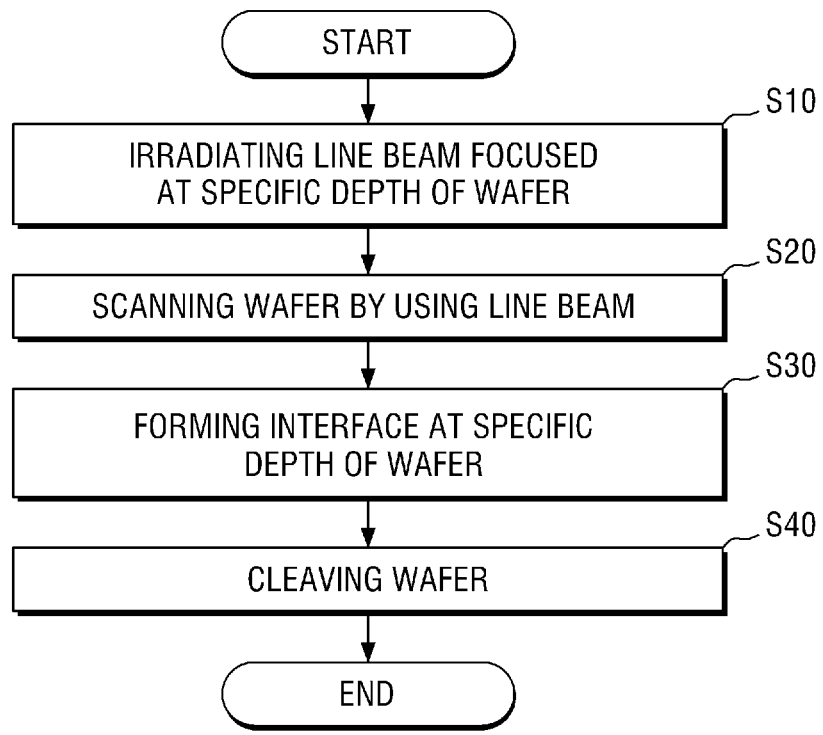
FIG. 4 is a flow chart illustrating a method for thinning a wafer according to an exemplary embodiment of the present invention.
Figure 5:
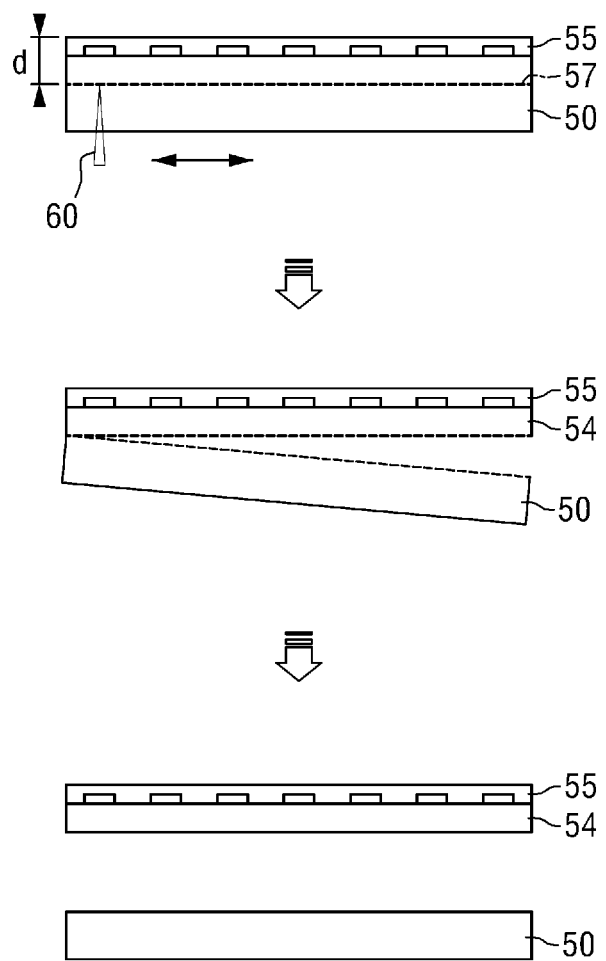
FIG. 5 is a conceptual view illustrating a process of thinning the wafer according to the embodiment of FIG. 4.
Figure 6:
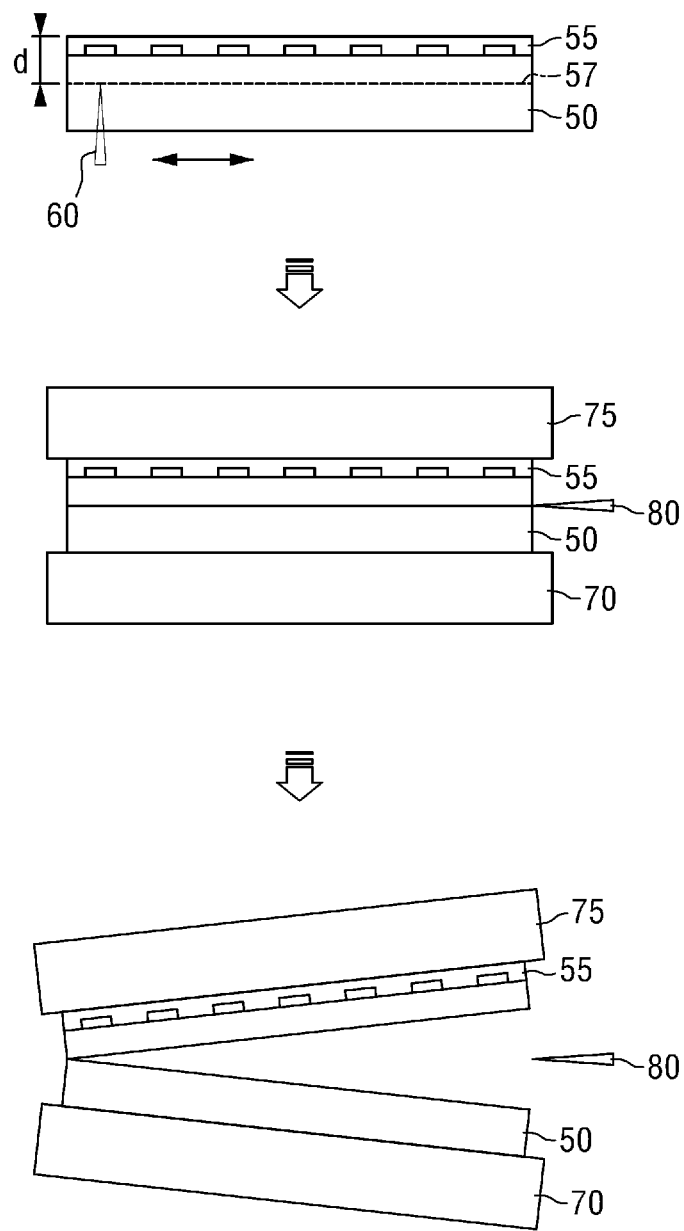
FIG. 6 is a conceptual view illustrating a cleaving process in the process of thinning the wafer according to the embodiment of FIG. 4.
Figure 7:
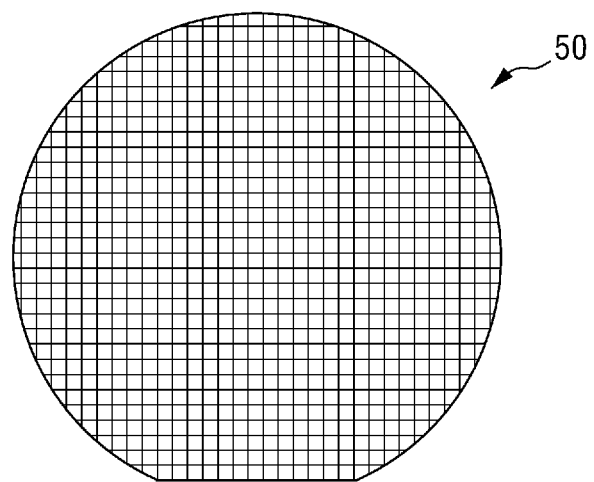
FIG. 7 is a cross-sectional view illustrating grid lines of a wafer formed during the process of thinning the wafer according to the embodiment of FIG. 4.

FIG. 4 is a flow chart illustrating a method for thinning a wafer according to an exemplary embodiment of the present invention. FIG. 5 is a conceptual view illustrating a process of thinning the wafer according to the embodiment of FIG. 4. FIG. 6 is a conceptual view illustrating a cleaving process in the process of thinning the wafer according to the embodiment of FIG. 4. FIG. 7 is a cross-sectional view illustrating grid lines of a wafer formed during the process of thinning the wafer according to the embodiment of FIG. 4.

Referring to FIG. 4 through FIG. 6, the method for thinning a wafer according to an exemplary embodiment of the present invention may include: irradiating a line beam 60 focused at a specific depth of a wafer 50 (S10); scanning the wafer 50 by using the line beam 60 (S20) and forming an interface 57 at the specific depth of the wafer 50 (S30); and cleaving the wafer 50 on which the interface 57 is formed into a pattern wafer and a dummy wafer (S40). Here, the interface 57 refers to a cleaving-reference layer within the wafer 50, and the pattern wafer and the dummy wafer refer to a wafer having a circuit pattern 55 and a wafer having no circuit pattern 55, respectively, of the cleaved wafers.

That is, the method for thinning a wafer is characterized by scanning the wafer 50 in a plane direction by using the laser line beam 60 focused at a specific depth of the wafer 50 according to a desired thickness thereof to form the interface 57; and cleaving the wafer 50 into upper and lower portions based on a plane layer of the interface, thereby simply separating the wafer at the desired thickness thereof. Accordingly, since high productivity may be achieved within a short tact time and a mechanical grinding process may be omitted, variations in the overall thickness of the wafer may be minimized.

A laser may have a flat-top type line beam optical system, and the optical system may change a size of the laser beam in accordance to a size of an object wafer. The laser line beam 60 may be irradiated by adjusting a laser-focusing position to a cut depth of the wafer. In this case, the laser line beam 60 may be irradiated onto a surface opposite to a surface provided with the circuit pattern, of the wafer 50, whereby heat and impacts may be minimized in a region except for an internal layer of the wafer 50 on which the line beam 60 is concentrated. That is, in a region except for the interface 57, that is, the reference layer for cleaving the wafer 50 into upper and lower portions, impacts may be minimized.

In order to irradiate the line beam 60 focused at a specific depth of the wafer 50 (S10), a laser beam may be irradiated, and the irradiated laser beam may be shaped to generate the line beam 60. Accordingly, the laser may include a separate line beam optical system in order to generate the line beam 60.

In addition, when the interface 57 is formed at a specific depth of the wafer 50, grid pattern lines may be formed in a region positioned at the specific depth of the wafer 50. FIG. 7 illustrates grid pattern lines disposed at a desired position on a plane of the wafer 50, energy being further selectively applied to the grid pattern lines. These lines may be formed by, after scanning the wafer 50 using the line beam 60, rotating the wafer 50 at 90° and scanning the wafer using the line beam 60 in a plane direction, in the same manner. Therefore, the interface 57 may be formed at the specific depth of the wafer 50 in the plane direction and at the same time, the grid pattern lines may be formed at specific intervals. The grid pattern lines may remain on a surface of the pattern wafer after the cleaving process, may be attached to a wafer mount film for the assembling of a semiconductor, and may serve as a start point of a cut surface divided by stress occurring in the case of expanding the wafer mount film during a die bond or flip chip bond process. Through this, a process of thinning the wafer 50 to a desired thickness by performing scanning using the laser line beam 60 and a sawing or dicing process of cutting the wafer 50 into portions having desired sizes may be replaced.

In addition, in the case of cleaving the wafer 50 provided with the interface 57 into the pattern wafer and the dummy wafer (S40), movable wafer chucks 70 and 75 fixing both surfaces of the wafer 50 thereto may move in opposite directions to separate the portions of the wafer 50 from each other. In addition, in order to facilitate the cleaving of the wafer 50, an impact applying member 80 applying mechanical force to the interface 57 may be used.

After cleaving the wafer 50 into the pattern wafer and the dummy wafer (S40), the pattern wafer separated to have a desired thickness may be provided in a polishing process in order to uniformalize a separate surface thereof, and the remainder dummy wafer separated from the pattern wafer may be put in a FAB process, again, to be recycled into a new pattern wafer. Accordingly, the unnecessary dummy wafer 50 may be recycled.

Figure 8:
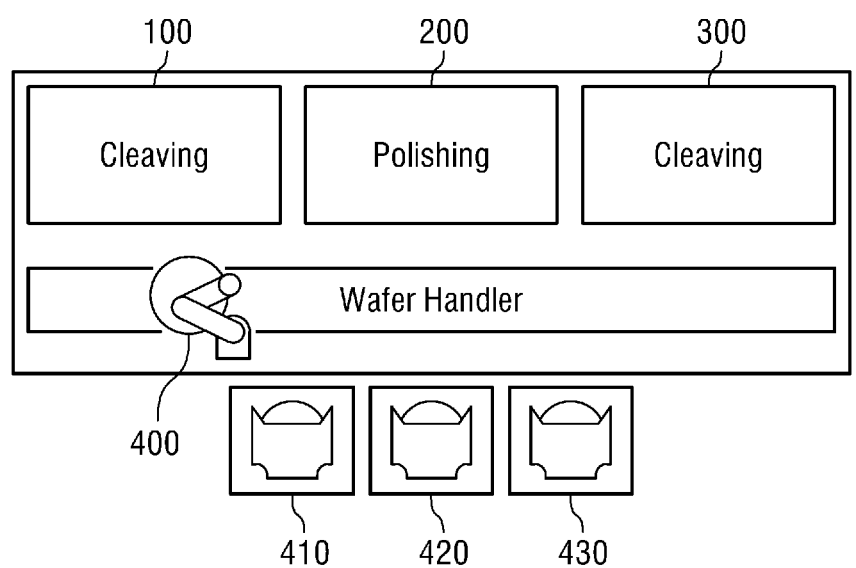
FIG. 8 is a conceptual view illustrating a process of processing the wafer according to the embodiment of FIG. 4.

FIG. 8 is a conceptual view illustrating a process of processing the wafer according to the embodiment of FIG. 4.

Referring to FIG. 8, the wafer 50 received in a wafer magazine 410 may be provided in a cleaving process 100 by a wafer handler 400 to be subjected to the process, and the wafer 50 having completed the cleaving 100 may be divided into the pattern wafer and dummy wafer. Thereafter, the pattern wafer may be provided in a polishing process 200 by the wafer handler 400 to uniformalize the surface of the pattern wafer and then, may be received in a pattern wafer magazine 420. In addition, the dummy wafer may be separately received in a dummy wafer magazine 430 by the wafer handler 400, and the dummy wafer received in the dummy wafer magazine 430 may be put in the FAB process to be recycled into a new wafer.

Thus, selective thinning may be allowed by changing an irradiation depth of the line beam 60 according to a desired thickness of the wafer 50. In addition, since the wafer 50 may be thinned to a desired thickness by only the cleaving, a reduction in process time as well as a reduction in waste water may be possible and the unnecessary dummy wafer 50 may be recycled. Through this, mechanical stress and chemical stress of the wafer 50 may be minimized. In addition, the interface 57 may be formed at a specific depth of the wafer 50 in the plane direction and at the same time, the grid pattern lines may be formed at specific intervals, such that the grid pattern lines may be a start point of a cut surface divided by stress occurring in the case of expanding a wafer mount tape during a bonding process after the cleaving process and accordingly, may replace a process of thinning the wafer 50 to a desired thickness and a sawing process of cutting the wafer 50 to the desired size.

Figure 9:
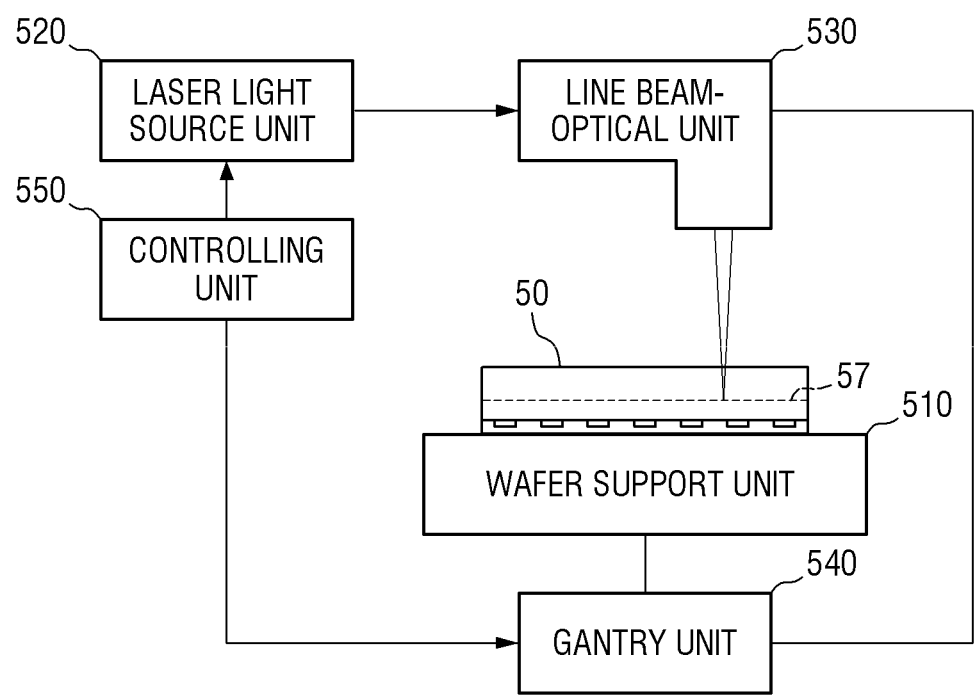
FIG. 9 and FIG. 10 are configuration diagrams of an apparatus for thinning the wafer according to an exemplary embodiment of the present invention.
Figure 10:
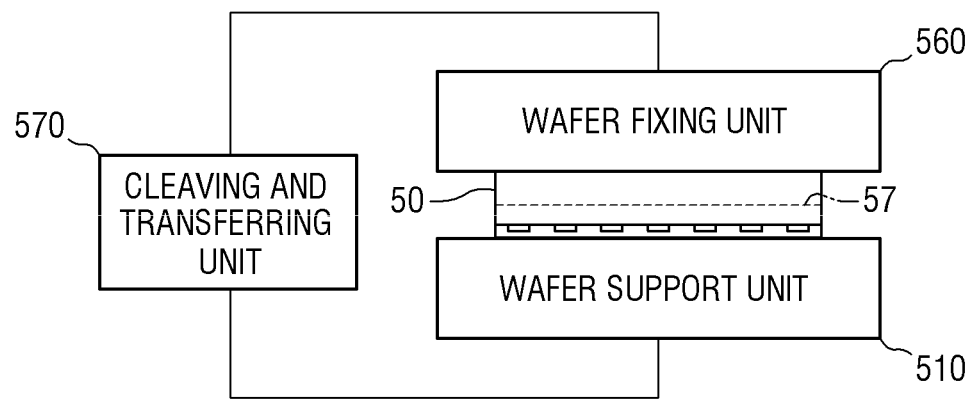

FIG. 9 and FIG. 10 are configuration diagrams of an apparatus for thinning the wafer according to an exemplary embodiment of the present invention.

An apparatus 500 for thinning the wafer according to an exemplary embodiment of the present invention may include a wafer support unit 510 supporting and fixing one surface of the wafer 50 thereby, a laser light source unit 520 irradiating a laser beam, a line beam-optical unit 530 generating the line beam by shaping the laser beam and irradiating the line beam to a specific depth of the wafer 50 in accordance with a size of the wafer 50, a gantry unit 540 transferring at least one of the line beam-optical unit 530 or the wafer support unit 510 in an XY direction in order to scan the wafer 50 using the line beam, a wafer fixing unit 560 fixing the other surface of the wafer 50, and a cleaving and transferring unit 570 transferring the wafer support unit 510 and the wafer fixing unit 560 in opposite directions and cleaving the wafer 50 into the pattern wafer and the dummy wafer based on the interface 57 formed at the specific depth of the wafer 50 by scanning using the line beam. In addition, the apparatus 500 for thinning the wafer according to an exemplary embodiment of the present invention may include a controlling unit 550 controlling an output of the laser light source unit 520 to adjust the intensity of the line beam or controlling the gantry unit 540 to adjust a scan rate of the line beam.

The wafer support unit 510 may serve to support one surface of the wafer 50 and may fix the wafer 50 during the cleaving of the wafer 50.

The laser light source unit 520 may supply a laser beam, and a laser source may include all lasers having photon energy. It would be obvious to a person having ordinary skill in the art that the laser light source unit 520 may use adoptable, any types of lasers such as a diode laser, an infrared rays laser, a DPSS laser, a KrF excimer laser, a nanosecond laser and the like.

The line beam-optical unit 530 may serve to optically shape the laser beam so as to have a cross-sectional shape of the line beam required in laser processing. The line beam-optical unit 530 may optically shape the incident laser beam in such a manner that the cross-sectional shape of the laser beam has a predetermined length and width while the laser beam has a uniform intensity. For example, the line beam-optical unit 530 may focus the laser beam by a field aperture to generate a line beam having a rectangular cross-sectional shape. Alternatively, for an incident laser beam having one circular spot, the line beam-optical unit 530 may increase the number of circular spots by an amount equal to that in a plurality of laser beams and may allow the plurality of circular spots to be aligned in a row on a focus surface. The line beam-optical unit 530 may generate a line beam in which some of the plurality of circular spots may overlap with each other and thus, Gaussian intensity distribution may be flat-topped in one-dimensional direction. In addition to this, it would be obvious to a person having ordinary skill in the art that another method for shaping the laser beam into the line beam may be applied.

The gantry unit 540 may serve to scan the wafer 50 using the line beam and in order to scan the wafer 50, may transfer at least one of the line beam-optical unit 530 or the wafer support unit 510 in an XY direction. By the gantry unit 540, a two-dimensional plane of the wafer 50 having a predetermined depth may be vertically scanned using the line beam.

The controlling unit 550 may control an output of the laser light source unit 520 to adjust the intensity of the line beam or control the gantry unit 540 to adjust a scan rate of the line beam, whereby grid pattern lines may be formed at a desired position on an internal plane of the scanned wafer 50, energy being further selectively applied to the grid pattern lines. Therefore, the interface may be formed at the specific depth of the wafer 50 in the plane direction and at the same time, the grid pattern lines may be formed at specific intervals.

The wafer fixing unit 560 may serve to fix the other surface of the wafer 50 in the opposite side of the wafer support unit 510. The wafer fixing unit 560 and the wafer support unit 510 may fix the both surfaces of the wafer 50 and may move in opposite directions, whereby the wafer 50 may be cleaved to have a desired thickness.

The cleaving and transferring unit 570 may provide driving force for transferring the wafer fixing unit 560 and the wafer support unit 510 in opposite directions, and by the operation of the cleaving and transferring unit 570, the wafer 50 may be cleaved into the pattern wafer and the dummy wafer based on the interface 57 formed at the specific depth of the wafer 50.

Therefore, by the apparatus 500 for thinning the wafer according to an exemplary embodiment of the present invention, a process of thinning the wafer 50 to a desired thickness by scanning the wafer 50 using the laser line beam 60 and a dicing process of cutting the wafer 50 into portions having desired die sizes may be replaced. Therefore, mechanical stress and chemical stress of the wafer 50 may be minimized.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A method for thinning a wafer, comprising:
    irradiating a line beam focused at a specific depth of a wafer on a surface opposite to a surface on which a circuit is disposed;
    scanning the wafer by using the line beam and forming an interface at the specific depth of the wafer; and
    cleaving the wafer in which the interface is formed into a pattern wafer and a dummy wafer.

2. The method of claim 1, wherein the irradiating of the line beam includes: irradiating a laser beam; and
    shaping the laser beam to generate the line beam.

3. A method for thinning a wafer, comprising:
    irradiating a line beam focused at a specific depth of a wafer;
    scanning the wafer by using the line beam and forming an interface at the specific depth of the wafer; and
    cleaving the wafer in which the interface is formed into a pattern wafer and a dummy wafer,
    wherein the forming of the interface includes:
        adjusting at least one of a scan rate of the line beam or an intensity of the line beam; and
        forming grid pattern lines at the specific depth of the wafer.

4. The method of claim 1, further comprising: forming a circuit pattern on the dummy wafer and recycling the dummy wafer.

* * * * *